United States Patent
Nagel et al.

(10) Patent No.: US 10,426,006 B2
(45) Date of Patent: Sep. 24, 2019

(54) OPTOELECTRONIC COMPONENT WITH PROTECTIVE CIRCUIT

(71) Applicant: OSRAM Opto Semiconductors GmbH, Regensburg (DE)

(72) Inventors: Peter Nagel, Regensburg (DE); Stefan Illek, Donaustauf (DE)

(73) Assignee: OSRAM Opto Semiconductors GmbH (DE)

( * ) Notice: Subject to any disclaimer, the term of this patent is extended or adjusted under 35 U.S.C. 154(b) by 146 days.

(21) Appl. No.: 15/210,174

(22) Filed: Jul. 14, 2016

(65) Prior Publication Data

US 2016/0323942 A1 Nov. 3, 2016

Related U.S. Application Data

(62) Division of application No. 14/429,390, filed as application No. PCT/EP2013/070280 on Sep. 27, 2013, now Pat. No. 9,418,972.

(30) Foreign Application Priority Data

Sep. 27, 2012 (DE) .................. 10 2012 217 523
Oct. 1, 2012 (DE) .................. 10 2012 217 932

(51) Int. Cl.
*H01L 25/16* (2006.01)
*H05B 33/08* (2006.01)
(Continued)

(52) U.S. Cl.
CPC .......... *H05B 33/083* (2013.01); *H01L 23/34* (2013.01); *H01L 25/162* (2013.01); *H01L 25/167* (2013.01); *H01L 25/50* (2013.01);
*H01L 27/15* (2013.01); *H01L 29/866* (2013.01); *H01L 33/62* (2013.01); *H05B 33/089* (2013.01);
(Continued)

(58) Field of Classification Search
CPC ..... H01L 25/16; H01L 25/162; H01L 25/167; H01L 27/15; H01L 27/153; H01L 27/156; H01L 33/62
See application file for complete search history.

(56) References Cited

U.S. PATENT DOCUMENTS

2001/0020705 A1   9/2001   Miyata
2001/0032985 A1  10/2001   Bhat et al.
(Continued)

FOREIGN PATENT DOCUMENTS

DE   10 2005 007 601 A1   9/2005
DE   10 2009 053 064 A1   5/2011
(Continued)

*Primary Examiner* — Bryan R Junge
(74) *Attorney, Agent, or Firm* — DLA Piper LLP (US)

(57) ABSTRACT

An optoelectronic component includes at least one first carrier with at least two light emitting diodes, wherein the diodes have electrical connections, the electrical connections are led to contact areas, and the contact areas are arranged on an underside of the first carrier; and a second carrier, wherein further contact areas are arranged on a top side of the second carrier, the first carrier bears by the underside on the top side of the second carrier and fixedly connects to the second carrier, and an electronic circuit for open-loop and/or closed-loop control of the power supply of the diodes is integrated in the second carrier.

7 Claims, 7 Drawing Sheets

(51) Int. Cl.
  *H01L 27/15* (2006.01)
  *H01L 23/34* (2006.01)
  *H01L 25/00* (2006.01)
  *H01L 29/866* (2006.01)
  *H01L 33/62* (2010.01)
  *H01L 33/00* (2010.01)

(52) U.S. Cl.
  CPC .. *H01L 33/0079* (2013.01); *H01L 2924/0002* (2013.01); *H01L 2933/0066* (2013.01)

(56) References Cited

U.S. PATENT DOCUMENTS

| | | |
|---|---|---|
| 2002/0149314 A1 | 10/2002 | Takahashi et al. |
| 2002/0171087 A1 | 11/2002 | Krames et al. |
| 2006/0060878 A1* | 3/2006 | Kim .............. H01L 25/167 257/99 |
| 2008/0029761 A1 | 2/2008 | Peng |
| 2008/0211416 A1* | 9/2008 | Negley ............ H01L 27/15 315/193 |
| 2009/0065800 A1 | 3/2009 | Wirth et al. |
| 2010/0006864 A1 | 1/2010 | Steigerwald |
| 2010/0078668 A1* | 4/2010 | Kim .............. H01L 33/486 257/98 |
| 2010/0301349 A1 | 12/2010 | Wang et al. |
| 2011/0057569 A1 | 3/2011 | Wei et al. |
| 2011/0266963 A1 | 11/2011 | Yang |
| 2011/0294240 A1 | 12/2011 | Kim |
| 2012/0049214 A1 | 3/2012 | Lowes et al. |
| 2012/0056543 A1 | 3/2012 | Yang et al. |
| 2012/0223416 A1 | 9/2012 | Scheubeck |
| 2012/0299747 A1 | 11/2012 | Schubert et al. |
| 2013/0020589 A1 | 1/2013 | Yu et al. |
| 2013/0240922 A1 | 9/2013 | Yamamoto |

FOREIGN PATENT DOCUMENTS

| | | |
|---|---|---|
| DE | 20 2011 001 604 U1 | 10/2011 |
| EP | 1 936 704 A2 | 6/2008 |
| JP | 2000-231363 A | 8/2000 |

* cited by examiner

OPTOELECTRONIC COMPONENT WITH PROTECTIVE CIRCUIT

TECHNICAL FIELD

This disclosure relates to an optoelectronic component with a protective circuit and a method of producing an optoelectronic component.

BACKGROUND

DE 20 2011 001 604 U1 discloses a voltage-limiting and polarity-reversed series-connected light emitting diode device. The light emitting diode device comprises at least one or a plurality of opposite-polarity parallel-connected or series-connected or series-parallel-connected light emitting diodes which are connected in parallel with a zener diode with identical polarity, wherein the light emitting diode device additionally comprises a second light emitting diode-zener diode assembly containing at least one or a plurality of identical-polarity parallel-connected or series-connected or series-parallel-connected light emitting diodes which are connected in parallel with zener diodes with identical polarity.

It could nonetheless be helpful to provide an optoelectronic component having a series connection of light emitting diodes, wherein the component is protected against failure of a diode and is simple and cost-effective to produce.

SUMMARY

We provide an optoelectronic component including at least one first carrier with at least two light emitting diodes, wherein each diode has two electrical connections, each electrical connection is led to a contact area, and the contact areas are arranged on an underside of the first carrier; and a second carrier, wherein at least two zener diodes are arranged in the second carrier, the zener diodes have further electrical connections, each further electrical connection is led to a further contact area, the further contact areas are arranged on a top side of the second carrier, the first carrier bears by the underside on the top side of the second carrier and fixedly connects to the second carrier, the zener diodes antiparallelly connect to the diodes, the contact areas of a diode electrically contact the further contact areas of a zener diode, the zener diodes electrically connect in series, the diodes electrically connect in series, and the first carrier and/or the second carrier are/is part of a wafer.

We also provide a method of producing an optoelectronic component including a first wafer, wherein at least two light emitting diodes are arranged on the first wafer, two electrical connections are provided for the diodes, a contact area is provided for each electrical connection, the contact area connecting to an electrical connection, the contact areas are arranged on an underside of the first wafer, at least two zener diodes are provided on a second wafer, the zener diodes connect to further electrical connections, the first wafer is placed by the underside onto the top side of the second wafer and connects to the second wafer, the contact areas of a diode and the further contact areas of a zener diode are brought into contact via electrical lines, the first wafer is arranged and connected to the second wafer such that a zener diode antiparallelly connects to the diode, the zener diodes are electrically connected in series, and the diodes are electrically connected in series.

We further provide an optoelectronic component including at least one first carrier with at least two light emitting diodes, wherein the diodes have electrical connections, the electrical connections are led to contact areas, and the contact areas are arranged on an underside of the first carrier; and a second carrier, wherein further contact areas are arranged on a top side of the second carrier, the first carrier bears by the underside on the top side of the second carrier and fixedly connects to the second carrier, and an electronic circuit for open-loop and/or closed-loop control of the power supply of the diodes is integrated in the second carrier.

We yet further provide the component wherein a controllable switch is provided in parallel with at least one diode, the switch is integrated in the second carrier, a control circuit is integrated in the second carrier, and the control circuit connects to the switch.

We still further provide a method wherein at least two light emitting diodes are arranged on a first wafer as the first carrier, two electrical connections are provided for the diodes, a contact area is provided for each electrical connection, said contact area connecting to an electrical connection, the contact areas are arranged on an underside of the first wafer, at least two zener diodes are provided on a second wafer as the second carrier, the zener diodes connect to further electrical connections, the first wafer is placed by the underside onto the top side of the second wafer and connects to the second wafer, the contact areas of a diode and the further contact areas of a zener diode are brought into contact via electrical lines, the first wafer is arranged and connected to the second wafer such that a zener diode antiparallelly connects to the diode, the zener diodes are electrically connected in series, and the diodes are electrically connected in series and the series connection of the zener diodes and of the diodes is produced by an electrical line applied on the second wafer, or the series connection of the zener diodes and of the diodes is produced by an electrical line applied on the first wafer.

REFERENCE SIGNS

Figure 1:
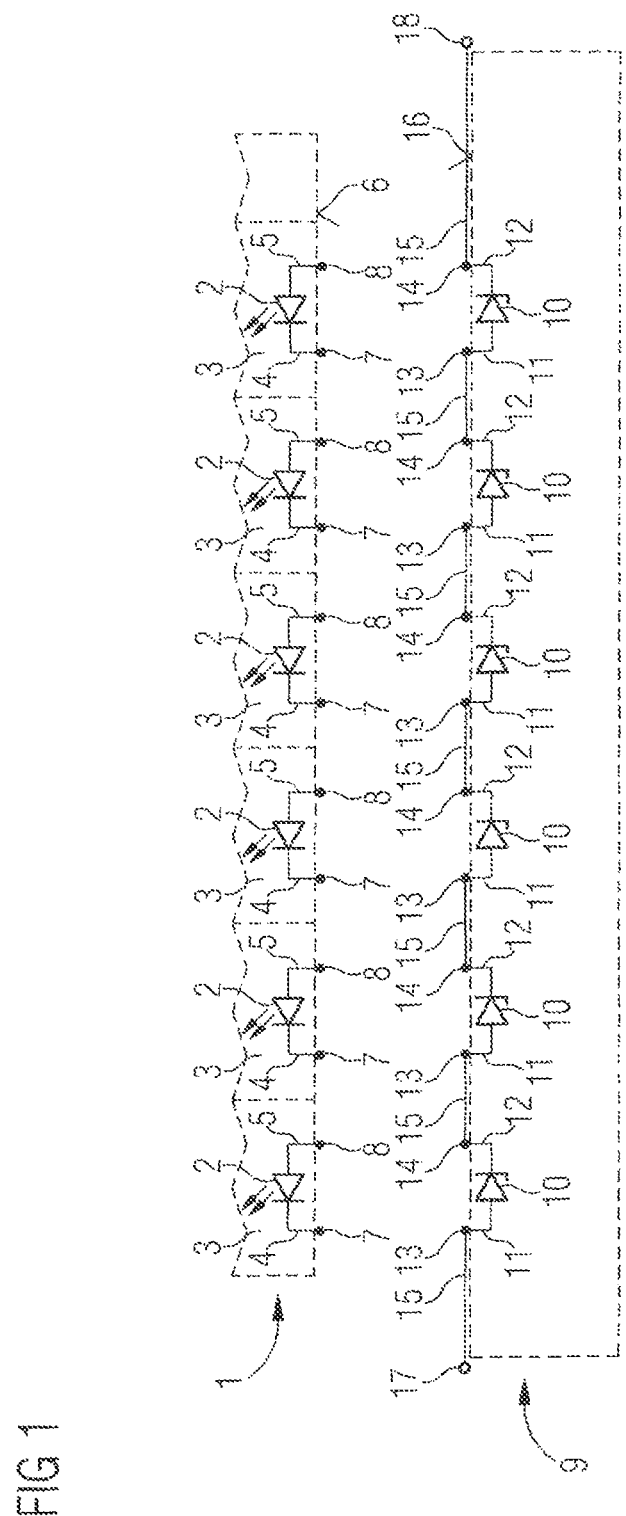
FIG. 1 shows a schematic illustration of a first carrier with light emitting diodes and a second carrier with zener diodes.

1 $1^{st}$ carrier
2 diode
3 region
4 $1^{st}$ connection
5 $2^{nd}$ connection
6 underside of $1^{st}$ substrate 7 1st contact area
8 2nd contact area
9 2nd carrier
10 zener diode
11 further 1st connection
12 further 2nd connection
13 further 1st contact area
14 further 2nd contact area
15 electrical line
16 top side of 2nd substrate
17 1st connection point
18 2nd connection point
21 1st diode
22 2nd diode
23 3rd diode
24 4th diode
25 5th diode
31 1st zener diode
32 2nd zener diode
41 1st switch
42 2nd switch
43 3rd switch
45 contact material region
50 control circuit
51 control input
60 sensor
70 microcontroller
80 device for adapting an input voltage

DETAILED DESCRIPTION

Our optoelectronic component has the advantage that it is simple and cost-effective to produce. This is achieved by the fact that at least one first carrier is provided in which at least two diodes are provided, and/or that at least two first carriers with at least one diode are provided, that a second carrier is provided, in which a plurality of zener diodes connect in series, and that the first carrier or the first carriers connect to the second carrier, wherein the electrical connections of a diode are in contact with electrical connections of a zener diodes. The first carrier and/or the second carrier are/is preferably a part of a wafer or are/is a wafer. In this way, a series connection of zener diodes and a series connection of diodes are obtained, wherein a light emitting diode is antiparallelly connected to a zener diode.

The component affords the advantage that in the event of failure of one of the light emitting diodes connected in series, the optoelectronic component nevertheless still functions since the light emitting diode that has failed is bridged by the antiparallelly connected zener diode.

By virtue of the arrangement of the light emitting diodes in the first carrier separately from the zener diodes in the second carrier, both the light emitting diodes and the zener diodes can be produced by different methods and/or on different carriers. This results in an increased flexibility during production of the optoelectronic component. In addition, the production methods can be individually coordinated with the light emitting diodes and the zener diodes, respectively. Furthermore, different carriers can be used for the light emitting diodes and the zener diodes. As a result, quality can be increased and costs can also be saved.

A breakdown voltage of a zener diode may be greater than a threshold voltage of a light emitting diode. This ensures that, in a light emitting diode functioning correctly, no or as little current as possible flows via the zener diode. A low current consumption is ensured as a result.

At least two diodes may be arranged in series and/or antiparallelly with respect to a zener diode. An increased flexibility in the choice and arrangement of light emitting diodes is made possible in this way. Depending on the chosen application, it may be advantageous to arrange a plurality of light emitting diodes in series and/or in parallel to achieve a desired brightness and/or a desired color locus for the emitted light. By way of example, light emitting diodes having different wavelengths can be arranged in series and/or in parallel.

Antiparallelly to at least one light emitting diode, at least two diodes can connect in series and/or in parallel. The arrangement of a plurality of zener diodes makes it possible to achieve an improved bridging in conjunction with low reverse current.

The first and/or the second carrier comprise(s) silicon, or may in particular be part of a silicon wafer. As a result, production of the zener diodes is possible in a simple and cost-effective manner.

An electronic circuit for open-loop and/or closed-loop control of the power supply of the light emitting diodes may be integrated in the second carrier. In this way, first, production of the electronic circuit is decoupled from production of the light emitting diodes both with regard to the process and the carrier used. This enables an increased flexibility which can lead to an increased quality, to a cost-effective process and to a faster method. In addition, a compact and cost-effective component is obtained as a result of integration of the electronic circuit into the second carrier.

The at least two light emitting diodes may be electrically insulated from one another in the first carrier. An electrically conductive connection between the at least two diodes of the first carrier is produced only by fixing the first carrier on the second carrier and electrical contacting the electrical lines of the zener diodes of the second carrier or formation of the electrical lines, for example, by contact material. A simple and cost-effective production of the optoelectronic component is achieved in this way.

The at least two zener diodes may be electrically insulated from one another in the second carrier. An electrically conductive connection between the at least two zener diodes of the second carrier is produced only by fixing the first carrier on the second carrier and the electrical contacting of the electrical lines of the light emitting diodes of the second carrier or formation of the electrical lines, for example, by contact material. A simple and cost-effective production of the optoelectronic component is achieved in this way.

A sensor may be integrated in the second carrier. Cost-effective manufacture is thus possible. The sensor can be, for example, an optical sensor and/or a temperature sensor. The sensor connects to a control circuit, which sets a power supply of at least one of the light emitting diodes depending on the output signal of the sensor. For this purpose, the control circuit can connect to the power supply and/or connect to controllable switches connected in parallel with the diodes.

The component can be produced in a simple manner by two wafers being connected to one another, wherein a first wafer constitutes at least one first carrier and the second wafer constitutes at least one second carrier. The connected wafers can be divided into individual components comprising a first and a second carrier.

The above-described properties, features and advantages, and the way in which they are achieved, will become clearer and more clearly understood in association with the description of the examples which are explained in greater detail in association with the drawings.

FIG. 1 shows in a schematic illustration a first carrier 1 in which light emitting diodes 2 are arranged. The first carrier 1 has regions 3. In the illustrated example, an individual light emitting diode 2 is arranged in each region 3. Each light emitting diode 2 has a first and a second connection 4, 5. The connections 4, 5 are in the form of electrical lines in the first carrier 1 and are led from the diode 2 to an underside 6 of the first carrier 1. The first connection 4 is led to a first contact area 7 and the second connection 5 is led to a second contact area 8. The first and second contact areas 7, 8 are formed on the underside 6 of the first carrier 1. The construction and production of the diodes 2 will not be discussed in specific detail. These methods are known and described in DE 10 2005 007 601 A1, for example.

A second carrier 9 is illustrated, wherein a plurality of zener diodes 10 are integrated in the second carrier 9. Each zener diode 10 has a further first connection 11 and a further second connection 12. The further first connection 11 is led to a further first contact area 13 and the further second connection 12 is led to a further second contact area 14. In the illustrated example, the zener diodes 10 connect in series, wherein a further first contact area 13 of a zener diode connects via an electrical line 15 to a further second contact area 14 of an adjacent zener diode. Depending on the example chosen, at least the further first contact areas 13 and the further second contact areas 14 are arranged on a top side 16 of the second carrier 9. Depending on the example chosen, the electrical lines 15 can also be arranged on the top side 16 of the second carrier 9. In a simple example, a line 15 constitutes the further contact areas.

Depending on the example chosen, also between the first and second connections of adjacent light emitting diodes 2 an electrical line 17 can be arranged on the underside 6 of the first carrier 1 and connect the diodes 2 to one another in a series connection. In this example, the electrical lines 15 of the zener diodes 10 can also be dispensed with, wherein the further first and second contact areas 13, 14 are still necessary.

The second carrier 9 has a first connection point 17 connected via an electrical line 15 to a further first contact area 13 of an adjacent zener diode 10. In addition, the second carrier 9 has a second connection point 18 connected to a further second contact area 14 of a zener diode 10. The zener diodes 10 are arranged between the first and second connection points 17, 18 in the form of a series connection. The first and second connection points 17, 18 serve for connection to an operating voltage, which can be 150 V, for example.

Figure 2:
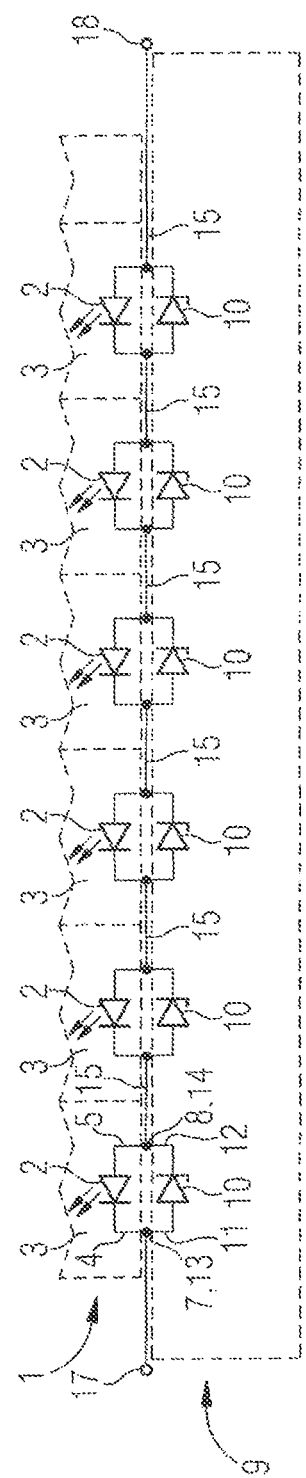
FIG. 2 shows a component including a first and a second carrier connected to one another, and having a series connection of light emitting diodes connected in parallel with zener diodes.

To produce an optoelectronic component, the underside 6 of the first carrier 1 is aligned with the top side 16 of the second carrier 9, wherein the first and second contact areas 7, 8 of a light emitting diode 2 are brought into contact with a further first contact area 13 and a further second contact area 14 of a zener diode 10 or a line 15, as is illustrated in FIG. 2. In this way, a component comprising light emitting diodes 2 connected in series is obtained, wherein a respective zener diode 10 is antiparallelly connected to each light emitting diode 2. The first and second carriers 1, 9 fixedly connect to one another, for example, by a bonding method, in particular a wafer bonding method, or a solder connection or an electrically conductive adhesive connection or a plug connection, wherein the electrical contacts between the diodes and the zener diodes are produced. By virtue of the arrangement illustrated in FIG. 1, the electrical lines 15 and/or the further first and second contact areas 13, 14 can be used to connect the diodes 2 electrically insulated from one another in the carrier 1 to form a series connection. The electrical lines 15 can be arranged on the second carrier 9 and in each case connect two further connection contacts of adjacent zener diodes. The electrical lines 15 can also be arranged on the first carrier 1 and in each case connect two connection contacts of adjacent diodes. In addition, the electrical lines 15 can also be formed only as a result of mounting the first and second carriers or only as a result of the mounting of a plurality of first carriers and the second carrier.

Depending on the example chosen, the diodes 2 can be, for example, in the form of identical diodes. In addition, the light emitting diodes 2 of the carrier 1 can also be in the form of different light emitting diodes 2. By way of example, the diodes 2 of the first carrier 1 can differ in terms of the wavelength of the emitted light.

Depending on the example chosen, the zener diodes 10 of the second carrier 9 can be in the form of identical zener diodes 10. In addition, the zener diodes 10 of the second carrier 9 can also be in the form of different zener diodes 10. The zener diodes 10 can differ, for example, in terms of the breakdown voltage and/or in terms of the breakdown current. In general, a zener diode 10 antiparallelly connected to a light emitting diode 2 has a breakdown voltage greater than the threshold voltage of the light emitting diode 2 at which the light emitting diode 2 emits light. This ensures that little or no parasitic current flows via the zener diodes 10 during the normal operation of the diodes 2.

In addition, the breakdown voltage of each zener diode 10 is designed such that in the event of failure of the antiparallelly connected diode 2, i.e., in the event of an interruption of the current flow through the antiparallelly connected diode 2 or an increase in the resistance of the diode 2, the breakdown voltage of the zener diode 10 is reached and the diode 2 that failed is short-circuited via the zener diode 10 antiparallelly connected. In this way, it is ensured that the series connection of the diodes 2 can continue to be operated even in the event of failure of one or a plurality of the diodes 2.

Depending on the example chosen, instead of one first carrier 1, a plurality of individual first carriers 1 are provided, wherein each first carrier 1 has at least one diode 2 and at least two first carriers 1 are provided. The plurality of first carriers 1 are placed onto the second carrier 9 as individual components successively, simultaneously or as groups. In addition, the individual first carriers 1 fixedly connect to the second carrier, for example, by a solder connection or an adhesive connection. In addition, the electrical contacts between the diodes and the zener diodes are produced during mounting, wherein the diodes connect in series, wherein the zener diodes connect in series, and wherein the series connection of the diodes and the series connection of the zener diodes antiparallelly connect.

In addition, the first carrier 1 can also have a plurality of rows of diodes 2 arranged alongside one another in parallel and contacted with correspondingly arranged rows of zener diodes of a second carrier. Consequently, arrays of diodes 2 can also interconnect with arrays of zener diodes.

Figure 3:
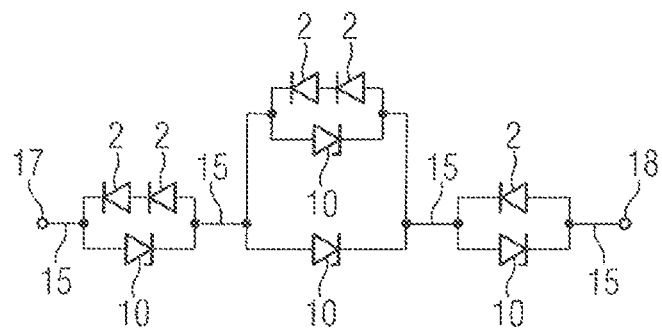
FIG. 3 shows an equivalent electrical representation of a further example of the component.

FIG. 3 shows a further example of a series connection of diodes 2 arranged in the first carrier 1, and of a series connection of zener diodes 10 antiparallelly connected and arranged in the second carrier 9. In this example, one or a plurality of series-connected diodes 2 antiparallelly connects with respect to a zener diode 10. In addition, it is also possible for one or a plurality of diodes 2 arranged in parallel to be arranged antiparallelly with respect to a zener diode 10.

Figure 4:
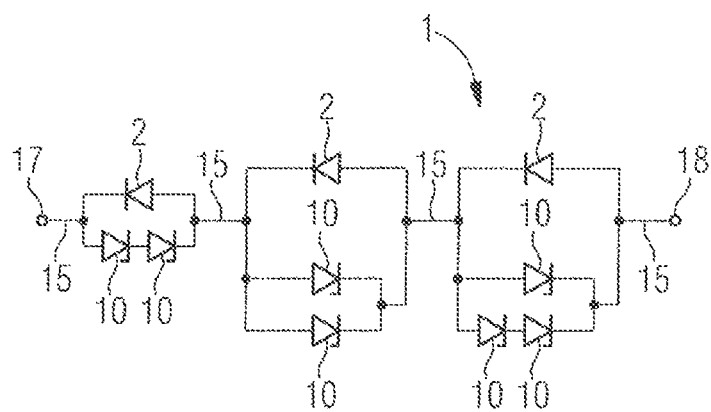
FIG. 4 shows a further example of a component.

FIG. 4 shows an equivalent circuit diagram of a further example of light emitting diodes 2 arranged in the first carrier and zener diodes 10 arranged in the second carrier. In the illustrated example, two series-connected zener diodes 10 antiparallelly connect with respect to a diode 2. In addition, a parallel connection of two zener diodes 10 antiparallelly connects in a further diode 2. Furthermore, a parallel connection of one zener diode 10 and two series-connected zener diodes 10 antiparallelly connects with respect to a diode 2.

Figure 5:
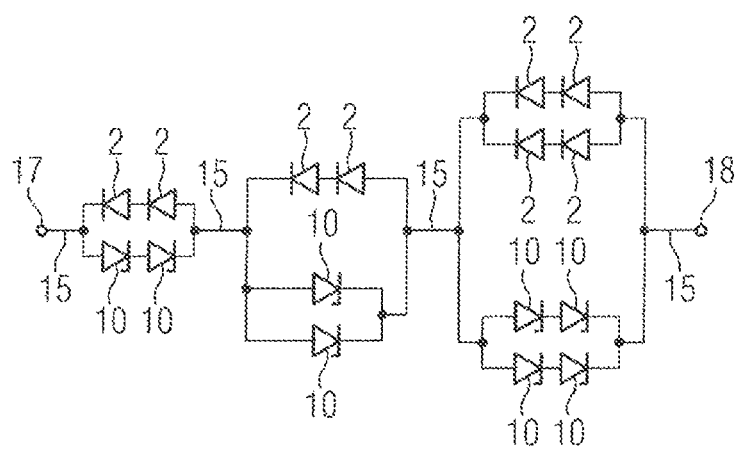
FIG. 5 shows an additional example of the component.

FIG. 5 shows an equivalent circuit diagram of a further example of a series connection of diodes 2 arranged in the first carrier, and of a series connection of zener diodes 10 arranged in the second carrier. In this case, two series-connected zener diodes 10 antiparallelly connect with respect to two series-connected diodes 2. In addition, a series connection of two diodes 2 antiparallelly connects with respect to a parallel connection of in each case one zener diode 10. Furthermore, in a further section, in each case two diodes 2 arranged in series in parallel antiparallelly connect with respect to in each case two series-connected zener diodes 10.

The examples in FIGS. 3 to 5 represent a selection of diodes 2 and zener diodes 10 arranged in parallel and in series. Depending on the example chosen, different combinations of series and parallel arrangements of diodes 2 can be provided between two first and second contact areas 7, 8. In addition, depending on the example chosen, different combinations of series and parallel arrangements of zener diodes 10 can be arranged between two further first and second contact areas 13, 14.

Figure 6:
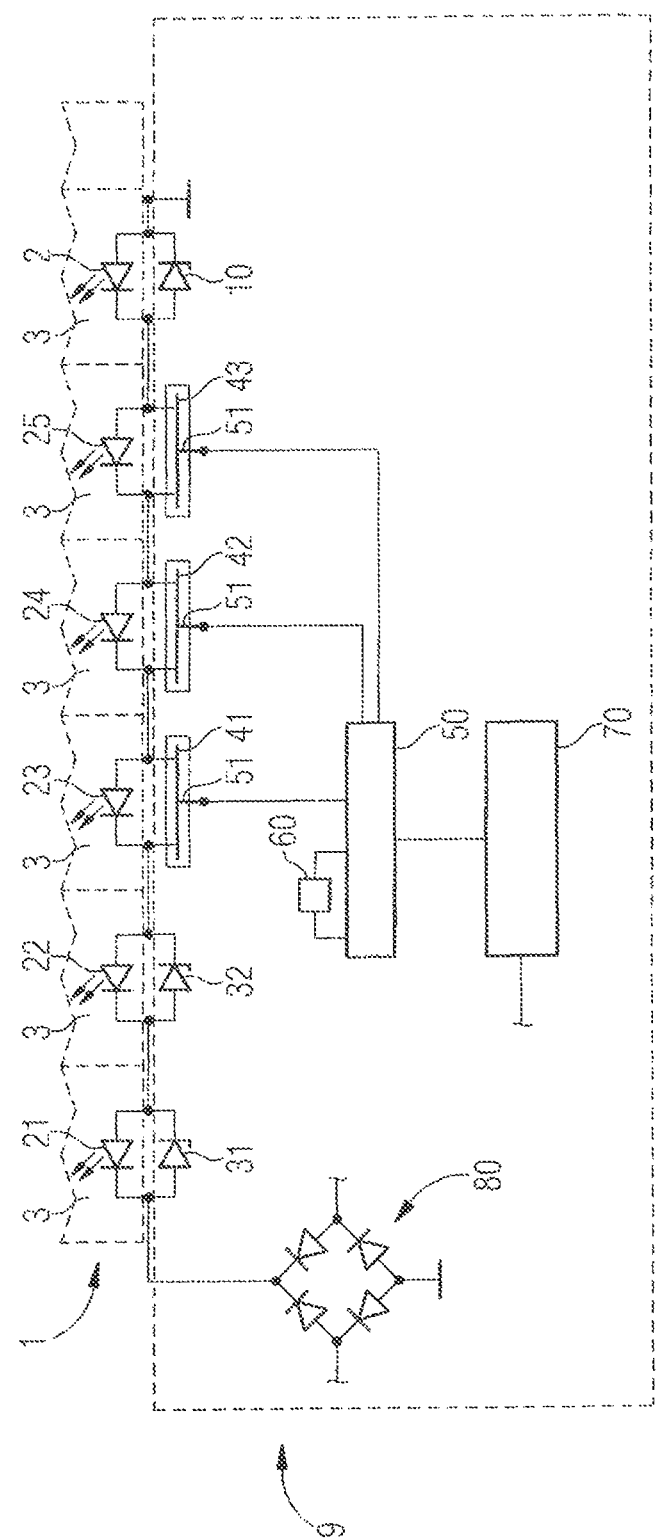
FIG. 6 shows an example of a component including electronic circuits in the second carrier.

FIG. 6 shows a further example of a component in which diodes 2 are arranged in the first carrier 1 and zener diodes 10 are arranged in the second carrier 9. In the illustrated example, a first and a second zener diode 31, 32, respectively, antiparallelly connect with respect to a first and a second diode 21, 22. A respective controllable switch 41, 42, 43 antiparallelly connects with respect to a third, fourth and fifth light emitting diode 23, 24, 25. Each switch 41, 42, 43 has an input and respectively an output, wherein the input connects to a first contact area 7 and the output connects to a second contact area 8 of the antiparallelly connected diode 23, 24, 25. In addition, the switches 41, 42, 43 have a control input connected to a control circuit 50. The control circuit 50 can be in the form of an open-loop or a closed-loop control. Furthermore, a sensor 60 is provided, which connects to the control circuit 50. The sensor 60 can be, for example, in the form of a photo sensor or a temperature sensor. The photo sensor detects light emitted by at least one diode and passes a corresponding signal to the control circuit 50 depending on the detected intensity of the light. Depending on the signal of the photo sensor, the control circuit 50 controls the current flow via the corresponding switch 41, 42, 43 by open-loop or closed-loop control. In this way, the light intensity and/or the color locus of the light emitted by the diode can be varied. Depending on the example chosen, a sensor, in particular a temperature sensor and/or a light sensor, can be provided for each diode 2. The sensor 60, the control circuit 50 and the switches 41, 42, 43 are preferably integrated into the second carrier 9. The switches 41, 42, 43 can be, for example, a transistor. In addition, further electronic circuits such as, e.g., a microcontroller 70, a rectifier or a device 80 that adapts an input voltage to the current and/or voltage requirements can be integrated into the second carrier 9. In addition, at least one metallization plane for electrical line connection can be integrated into the second carrier 9.

The carrier 1 can be, for example, from an electrically conductive or an electrically insulating carrier material such as, e.g., a metal foil, a plastic, a polymer, a semiconductor material composed of sapphire or silicon carbide. The second carrier 9 can be, for example, in the form of an insulating material or in the form of a semiconducting material, such as, e.g., silicon, in particular can be at least partly from a semiconducting material.

The zener diodes can be in the form of p-n structures having corresponding doping regions in the second carrier 9, in particular in a semiconductor material of the second carrier 9.

The light emitting diodes 2 can be, for example, in the form of thin-film diodes. The first carrier 1 and the second carrier 9 connect to one another, for example, by a solder layer, an adhesive layer or a bonding layer.

The first and/or the second carrier can be in the form of a layer, a film or in the form of a substrate. The layer can comprise a semiconductor material such as, e.g., silicon or germanium, in particular can consist of a silicon layer or germanium layer. In addition, the first carrier with the light emitting diodes can also be a thin-film chip. In addition, a carrier element with the at least one light emitting diode can also be a thin-film chip. The carrier with the diodes is produced, for example, by semiconductor layers being grown on a growth substrate, the semiconductor layers processed to form light emitting diodes and a carrier layer applied to the layer structure. The growth substrate is subsequently removed. The carrier layer with the at least one diode is subsequently placed onto the second carrier having the zener diodes and connects to the second carrier, wherein the electrical contacts between the diodes of the first carrier and the antiparallelly connected zener diodes are produced.

When a plurality of first carriers are used, the first carriers are placed onto the second carrier having the zener diodes and connect to the second carrier, wherein the electrical contacts between the diodes of the first carriers and the antiparallelly connected zener diodes are produced. By way of example, a first carrier constitutes an LED chip, for example, a thin-film LED chip.

A first carrier with a plurality of diodes may connect to a second carrier with a plurality of zener diodes to produce the component. By way of example, the first carrier can be a wafer and can connect to a second carrier in the form of a wafer. After the two wafers have been connected, the wafers are subdivided into components comprising a first carrier with at least one diode and a second carrier with at least one zener diode. By way of example, a component comprises a first carrier with at least two diodes and a second carrier with at least two zener diodes, wherein the zener diodes are antiparallelly connected with respect to the diodes.

Figure 7:
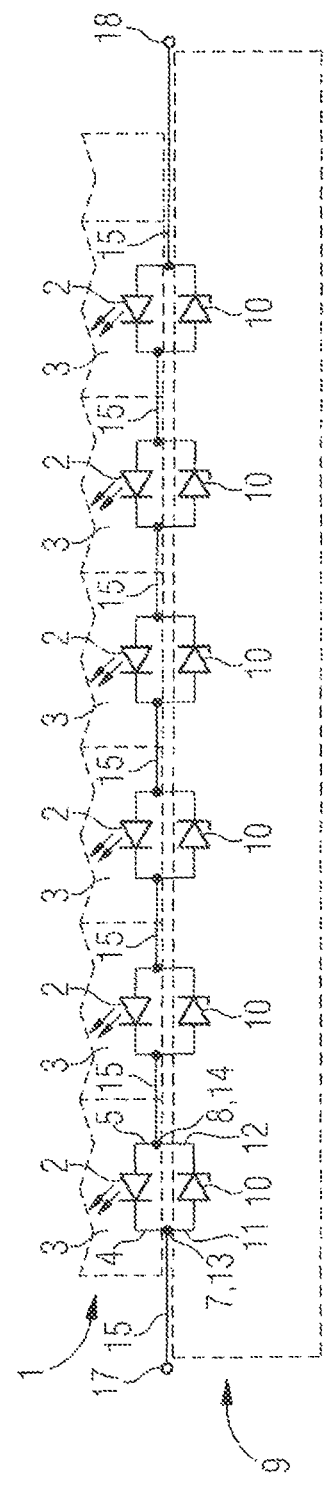
FIG. 7 shows a further example in which the electrical liens are formed on the first carrier before the mounting or the connection of first and second carriers.

FIG. 7 shows a further example in which the electrical lines 15 were already applied on the underside of the first carrier 1 before mounting, wherein an electrical line 15 connects two contact areas 7, 8 of adjacent diodes. Therefore, the diodes already connect in a series connection before mounting the carriers. In this case, it is possible to dispense with the electrical lines 15 at least between the zener diodes on the second carrier 9.

Figure 8:
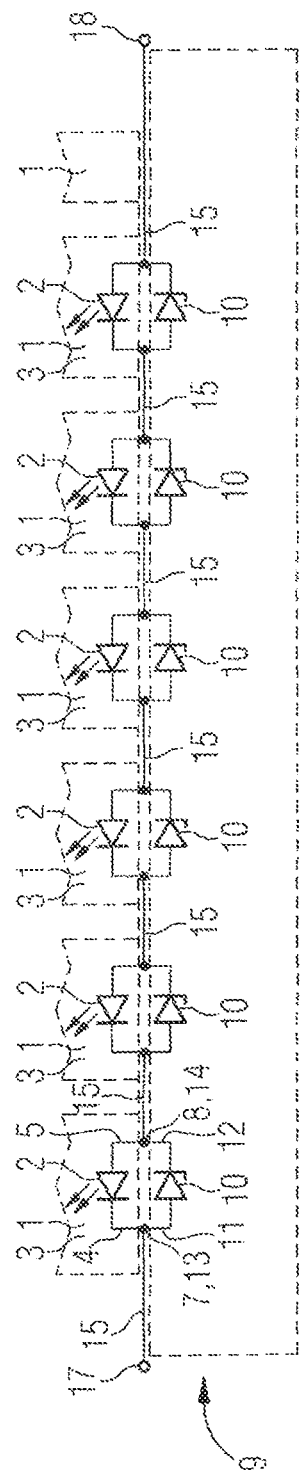
FIG. 8 shows an example in which a plurality of carriers are mounted onto a second carrier.

FIG. 8 shows in a schematic illustration an arrangement in accordance with FIG. 2, wherein, however, in contrast to FIG. 2, in FIG. 8 not just one first carrier 1, but a plurality of first carriers 1 are provided, which are fixed on the second carrier 9. Each first carrier has at least one diode, which are connected to contact areas 7, 8 via connections 4, 5. The zener diodes of the second carrier 9 are connected in series via the electrical lines 15. During the mounting of the individual first carriers 1, the contact areas 7, 8 of a first carrier contact two electrical lines 15 and/or the further contact areas 13, 14 of a zener diode, wherein the diode of the first carrier 1 antiparallelly connects with respect to a zener diode.

Figure 9:
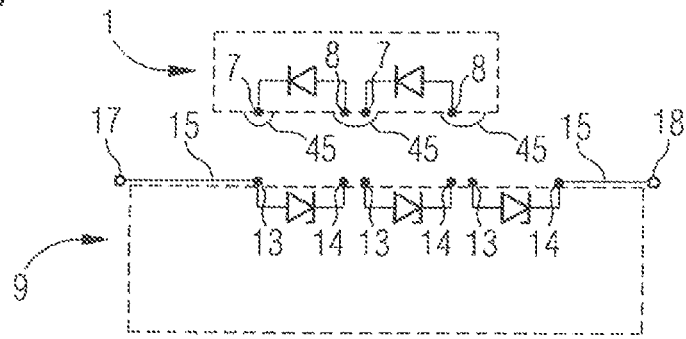
FIG. 9 shows a further example with a first and a second carrier before mounting.

FIG. 9 shows a further example of a first and a second carrier 1, 9. In this example, neither the first carrier 1 nor the second carrier 9 has electrical lines already connecting the diodes 2 or the zener diodes 10 in a series connection before mounting. Before mounting, contact material, i.e., contact material regions 45 as solder material, for example, is applied to the first carrier 1 in each case in the region of contact areas 7, 8 of adjacent diodes 2. Here already, the diodes 2 can electrically connect to form a series connection by the contact material regions, as is illustrated schematically in FIG. 9. However, this is not necessarily required.

Figure 10:
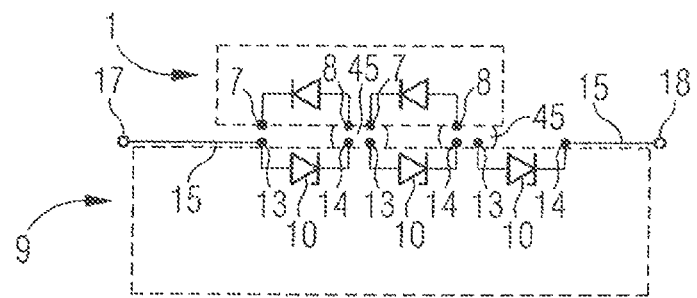
FIG. 10 shows the carriers from FIG. 9 after mounting.

During mounting, the first and second carriers 1, 9 are aligned and mounted such that the contact material 45 is arranged in the region of further contact areas 13, 14 of adjacent zener diodes 10. As a result of mounting, the contact material regions 45 are pressed apart such that the contact material regions cover larger regions. After mounting, as illustrated in FIG. 10, the diodes 2 electrically connect to form a series connection by the contact material regions 45. In addition, the zener diodes 10 also electrically connect to form a series connection by the contact material regions 45. Consequently, in this example, it is possible to dispense with the electrical lines 15 between the diodes 2 and/or between the zener diodes 10.

The contact material 45 can also be arranged on the second carrier 9 in the region of further contact areas 13, 14 of adjacent zener diodes 10. In addition, individual first carriers 1 with diodes 2 can also be mounted onto the second carrier 9 with the applied contact material 45, as illustrated in FIG. 8.

Although our components have been more specifically illustrated and described in detail by preferred examples, nevertheless this disclosure is not restricted by those examples and other variations can be derived therefrom by those skilled in the art, without departing from the scope of protection of the components as defined in the appended claims.

What is claimed is:

1. An optoelectronic component comprising:
    at least one first carrier with at least two light emitting diodes, wherein the diodes have electrical connections, the electrical connections are led to contact areas, and the contact areas are arranged on an underside of the first carrier; and
    a second carrier,
    wherein further contact areas are arranged on a top side of the second carrier, the first carrier bears by the underside on the top side of the second carrier and fixedly connects to the second carrier,
    wherein an electronic circuit for open-loop and/or closed-loop control of the power supply of the diodes is integrated in the second carrier, at least two zener diodes are arranged in the second carrier, the zener diodes have further electrical connections, each further electrical connection is led to a further contact area, and the further connections of the at least two zener diodes are insulated from one another and an electrically conductive connection of the two zener diodes is produced via an electrical line, and the electrical line is on or in the first carrier.

2. The component as claimed in claim 1, wherein the first carrier comprises a semiconducting layer in which the diodes are embodied.

3. The component as claimed in claim 1, wherein the first carrier and/or the second carrier are/is at least part of a wafer.

4. The component as claimed in claim 1, wherein the first carrier and/or the second carrier are/is at least part of a silicon wafer.

5. The component of claim 1, wherein, between two contact areas, at least two diodes are arranged in a manner connected in series and/or in parallel and/or wherein between two further contact areas at least two zener diodes are arranged in a manner connected in series and/or in parallel.

6. The component as claimed in claim 1, wherein a controllable switch is provided in parallel with at least one diode, the switch is integrated in the second carrier, a control circuit is integrated in the second carrier, and the control circuit connects to the switch.

7. The component as claimed in claim 1, wherein a sensor is integrated in the second carrier, the sensor connects to a control circuit, and the sensor is an optical sensor or a temperature sensor.

* * * * *